(12) United States Patent
Wang et al.

(10) Patent No.: US 7,101,722 B1
(45) Date of Patent: Sep. 5, 2006

(54) IN-LINE VOLTAGE CONTRAST DETERMINATION OF TUNNEL OXIDE WEAKNESS IN INTEGRATED CIRCUIT TECHNOLOGY DEVELOPMENT

(75) Inventors: John J. Wang, San Jose, CA (US); Jeffrey P. Erhardt, San Jose, CA (US); Wiley Eugene Hill, Moss Beach, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 74 days.

(21) Appl. No.: 10/839,444

(22) Filed: May 4, 2004

(51) Int. Cl.
*H01L 21/00* (2006.01)
(52) U.S. Cl. .................. 438/18; 257/E21.526
(58) Field of Classification Search .................. 438/18
See application file for complete search history.

(56) References Cited

U.S. PATENT DOCUMENTS

| | | | |
|---|---|---|---|
| 5,485,097 A * | 1/1996 | Wang | 324/765 |
| 6,228,665 B1 * | 5/2001 | Griffith et al. | 438/14 |
| 6,613,595 B1 * | 9/2003 | Fan et al. | 438/18 |
| 6,661,052 B1 * | 12/2003 | Matsui et al. | 257/316 |
| 6,751,519 B1 * | 6/2004 | Satya et al. | 700/121 |
| 6,858,450 B1 * | 2/2005 | Doan et al. | 438/14 |
| 6,861,666 B1 * | 3/2005 | Weiner et al. | 257/48 |

\* cited by examiner

*Primary Examiner*—W. David Coleman
(74) *Attorney, Agent, or Firm*—Mikio Ishimaru

(57) ABSTRACT

A method for determination of tunnel oxide weakness is provided. A tunnel oxide layer is formed on a semiconductor wafer. At least one poly gate is formed on the tunnel oxide layer in a flash memory region of the semiconductor wafer. At least one poly island, which is substantially larger than the poly gate, is formed on the tunnel oxide layer in a voltage contrast cell region of the semiconductor wafer. The poly island and the tunnel oxide layer therebeneath form a voltage contrast tunnel oxide cell. A voltage contrast measurement is performed on the voltage contrast tunnel oxide cell. The voltage contrast measurement is then compared with prior such voltage contrast measurements on other such voltage contrast tunnel oxide cells. The tunnel oxide weakness of the tunnel oxide layer is then determined from the voltage contrast measurement comparisons.

20 Claims, 3 Drawing Sheets

IN-LINE VOLTAGE CONTRAST DETERMINATION OF TUNNEL OXIDE WEAKNESS IN INTEGRATED CIRCUIT TECHNOLOGY DEVELOPMENT

BACKGROUND

1. Technical Field

The present invention relates generally to semiconductor technology, and more specifically to semiconductor research and development.

2. Background Art

At the present time, electronic products are used in almost every aspect of life, and the heart of these electronic products is the integrated circuit. Integrated circuits are used in a wide variety of products, such as televisions, telephones, and appliances.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers in processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes. To reduce costs, only a few wafers are actually processed for each cycle. This research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems. A continuing need persists, for example, for faster, more efficient, and more economical methods and systems for testing flash memory integrated circuits in the course of their manufacture. Flash memory devices, for example, are tested at various stages for various performance characteristics. One important test is to check the integrity of the tunnel oxide ("TOX") layer of the flash memory cells. Currently, TOX weakness is only detected at final electrical testing of the completed flash memory devices, that is, at the very end of the manufacturing process. A much earlier, in-line test is needed, particularly since TOX formation is one of the earliest steps in flash memory manufacturing.

In view of the considerable processing that happens before TOX weakness is identified under conventional fabrication procedures, it would be very beneficial to be able to pre-screen flash memory devices for TOX weakness at a much earlier production stage. Such earlier detection would enable much earlier process adjustments, would avoid financial losses from needlessly completing wafers that were destined to fail, would thereby significantly improve production efficiencies, would improve overall testing time, and would shorten development cycle times. Ideally, such earlier detection would be performed by a quick, in-line pre-screen method that requires minimal intervention and processing to detect such TOX weakness.

Solutions to these problems have been long sought but prior developments have not taught or suggested any solutions and, thus, solutions to these problems have long eluded those skilled in the art.

DISCLOSURE OF THE INVENTION

The present invention provides a method for determination of tunnel oxide weakness. A tunnel oxide layer is formed on a semiconductor wafer. At least one poly gate is formed on the tunnel oxide layer in a flash memory region of the semiconductor wafer. At least one poly island, which is substantially larger than the poly gate, is formed on the tunnel oxide layer in a voltage contrast cell region of the semiconductor wafer. The poly island and the tunnel oxide layer therebeneath form a voltage contrast tunnel oxide cell. A voltage contrast measurement is performed on the voltage contrast tunnel oxide cell. The voltage contrast measurement is then compared with prior such voltage contrast measurements on other such voltage contrast tunnel oxide cells. The tunnel oxide weakness of the tunnel oxide layer is then determined from the voltage contrast measurement comparisons. The invention thus provides a method and structure for detecting in-line tunnel oxide cell weakness by using a voltage contrast technique.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
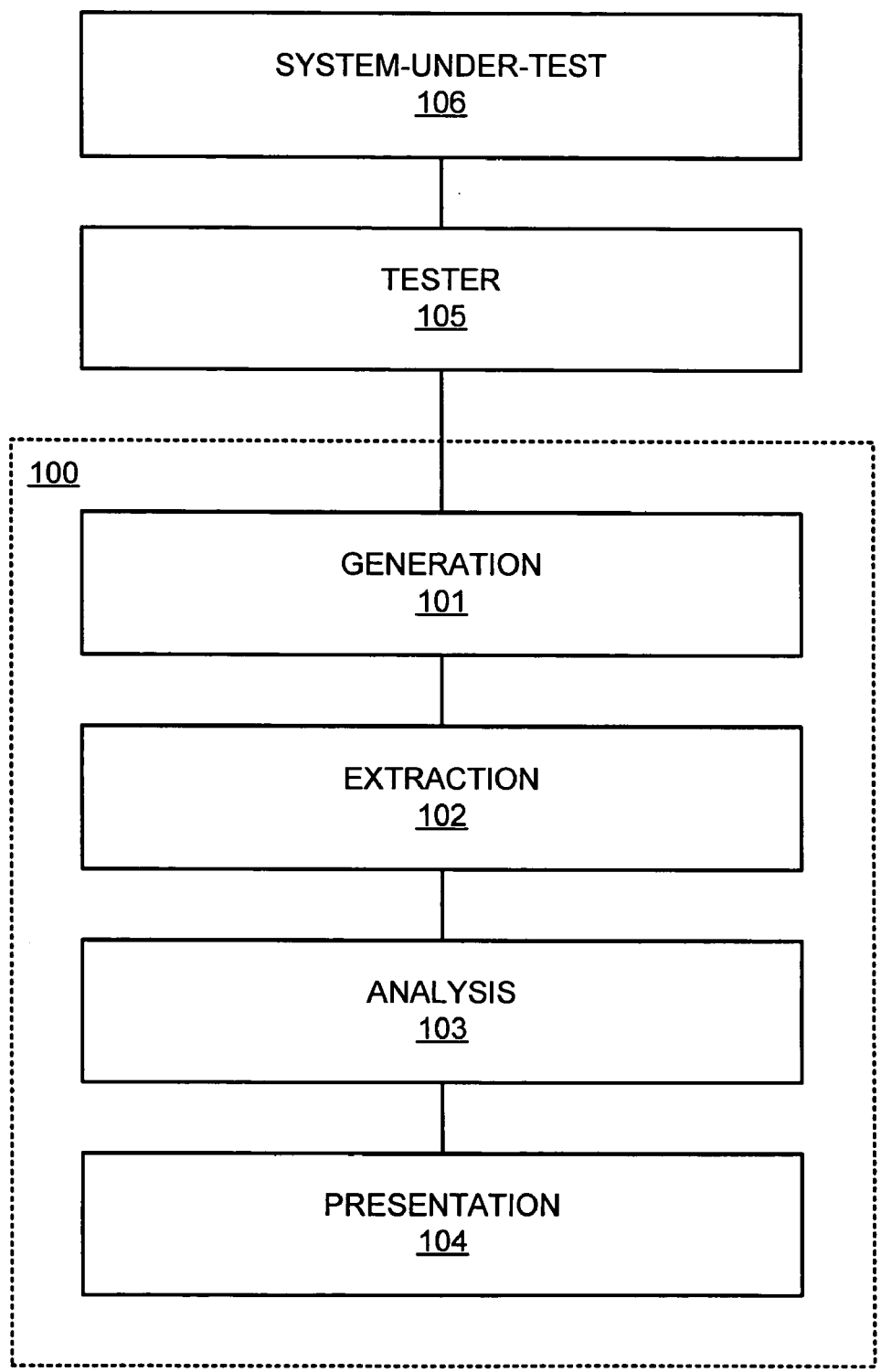
FIG. 1 is a block diagram of a tester information processing system according to the present invention.

In the following description, numerous specific details are given to provide a thorough understanding of the invention. However, it will be apparent that the invention may be practiced without these specific details. In order to avoid obscuring the present invention, some well-known process steps are not disclosed in detail. Likewise, the drawings showing embodiments of the device are semi-diagrammatic and not to scale and, particularly, some of the dimensions are for the clarity of presentation and are shown exaggerated in the FIGs. The same numbers are used in the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system 100 receives information from a tester 105, which is connected to a system-under-test 106.

In the integrated circuit field, the tester 105 can be a semiconductor test system for testing wafers or die, and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, conventional test information, a personal computer, and so forth. It may also require new equipment and/or methods, which are described herein when required.

In the extraction block 102, usable information is extracted from the generated information from the generation block 101. Essentially, the generated information is translated into forms that are more useful; e.g., broken apart so that it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points were determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
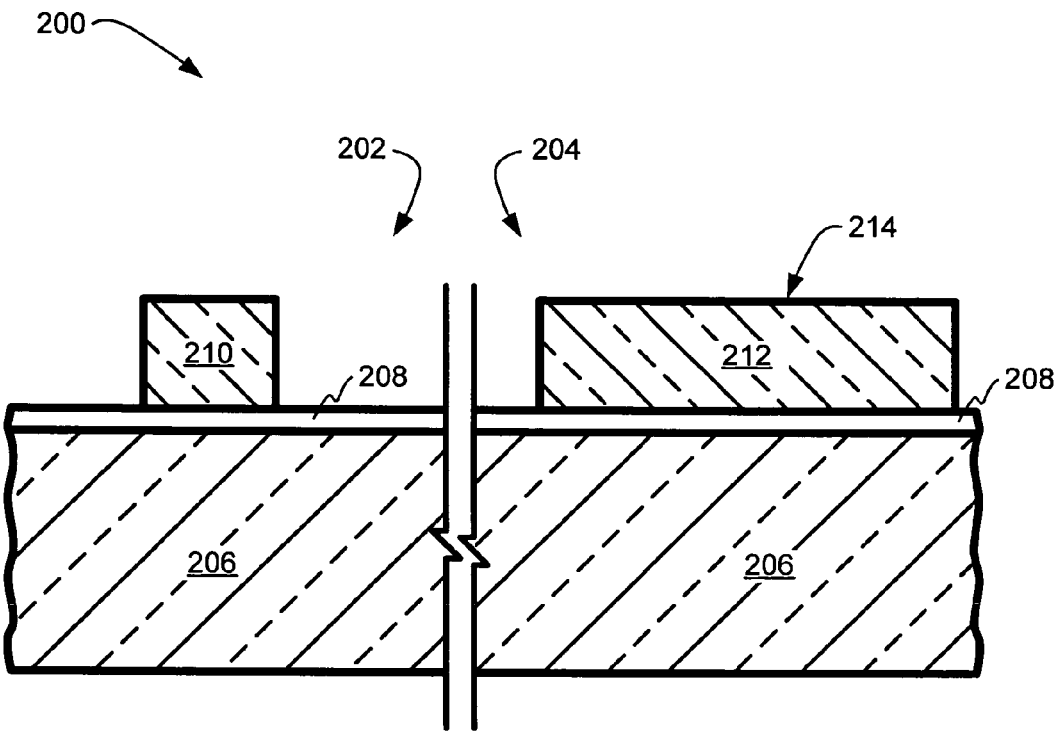
FIG. 2 is a fragmentary cross-sectional view of a portion of a semiconductor wafer in the earliest stages of the fabrication of flash memory cell devices.

Referring now to FIG. 2, therein is shown a fragmentary cross-sectional view of a small portion of a semiconductor wafer 200 in the earliest stages of the fabrication of flash memory cell devices thereon. In particular, a flash memory region 202 and a voltage contrast cell region 204 are depicted.

The semiconductor wafer 200 includes a silicon substrate 206 on which a tunnel oxide ("TOX") layer 208 has been grown. A first level poly ("P1") layer has been deposited, masked, and etched on the TOX layer 208 to form a P1 gate 210 in the flash memory region 202 and a P1 island 212 in the voltage contrast cell region 204. The semiconductor wafer 200 in this configuration constitutes part of the system-under-test 106 (FIG. 1).

It will be understood that the semiconductor wafer 200 will in fact be populated with many such P1 gates 210 throughout many such flash memory regions 202. However, it has been discovered, as taught by the present invention, that it is possible even at this very early stage of fabrication of the flash memory devices to test the TOX layer 208 for possible weakness.

The testing of the TOX layer 208 is afforded by the P1 islands 212 that are formed in various voltage contrast cell regions 204 distributed throughout the semiconductor wafer 200. Each of the P1 islands 212 in combination with the TOX layer 208 therebeneath forms a voltage contrast TOX cell 214. As can be seen, the voltage contrast TOX cells 214 are substantially larger than the P1 gates 210 to facilitate electrical testing of the voltage contrast TOX cells 214. That is, the dimensions of modem flash memory transistors are extremely small, making it quite difficult for test probes to contact the elements thereof, such as the P1 gates 210. Thus, the present invention provides various voltage contrast cell regions 204 throughout the semiconductor wafer 200 in which much larger P1 islands 212 are formed to facilitate electrical testing such as by test probes (not shown).

Thus, as indicated, following formation of the P1 gates 210 and the voltage contrast TOX cells 214, the TOX layer 208 is then tested by the tester 105 (FIG. 1) by individual application of a voltage to each of the P1 islands 212. The test results from the tester 105 are then generated by the generation block 101. In one embodiment, the voltage applied to each cell is individually adjusted to cause a constant standard testing current to flow through each of the voltage contrast TOX cells 214.

The extraction block 102 then extracts the voltage characteristics of each cell and forwards that information to the analysis block 103. In the one embodiment using such constant testing current, the voltage characteristics are the resulting voltages necessary to sustain the standard, constant testing current for each respective voltage contrast TOX cell 214.

Next, in the analysis block 103, the voltage characteristics of each of the voltage contrast TOX cells 214 are contrasted with (i.e., compared with) prior data that records similar tests of similar flash memory device voltage contrast TOX cells 214 that were previously similarly fabricated and tested.

Over time, a library of such voltage contrast data can be accumulated in the analysis block 103. Using this data library, the initial voltage contrast characteristics of the voltage contrast TOX cells 214 can be correlated with the final performance or failure characteristics of finished flash memory cells. In this way, the integrity or weaknesses of the TOX layer 208, as may be the case, can be detected and identified at the very preliminary fabrication stage depicted in FIG. 2. In particular, defective TOX will show different voltage contrast characteristics than normal TOX, and this will be revealed by the electrical behavior of the voltage contrast TOX cells 214 when tested, as described, in the tester 105. The voltage contrast data for each cell then assesses and reveals the TOX integrity of the corresponding region of the semiconductor wafer 200. Based upon prior experience, a determination can then be made whether to continue or discontinue manufacturing of the semiconductor wafer 200 as a function of the extent of TOX weakness detected by the voltage contrast TOX cells 214.

Figure 3:
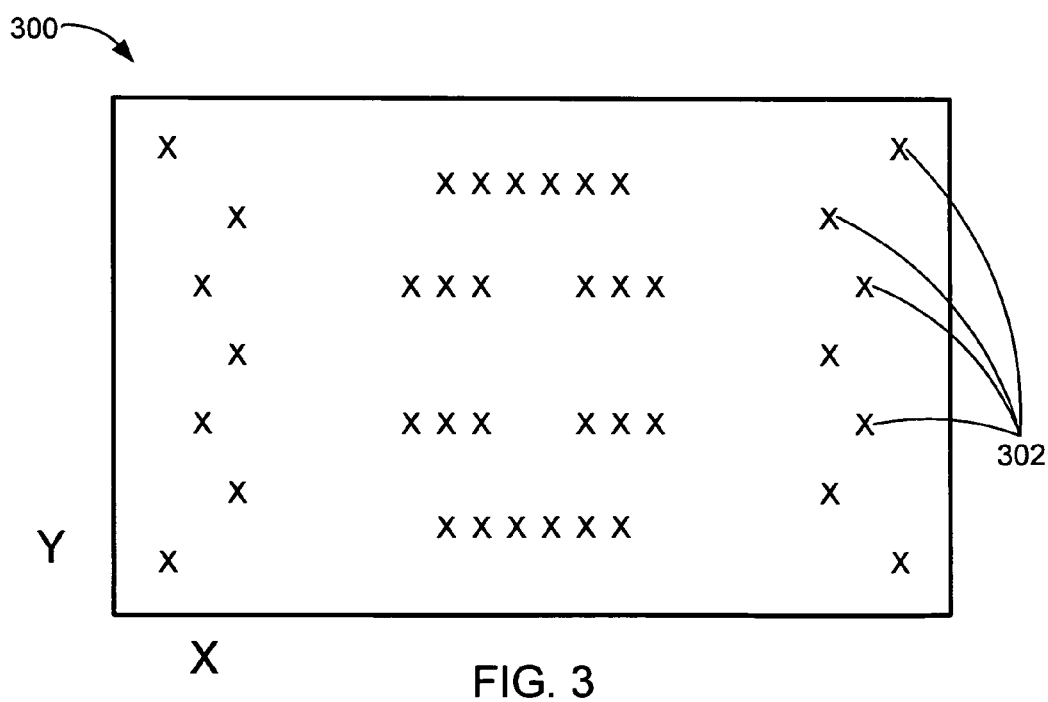
FIG. 3 is a representative portion of an X-Y bitmap depicting tunnel oxide defects in a semiconductor wafer.

Referring now to FIG. 3, therein is shown a small, representative portion of an X-Y bitmap 300 depicting TOX defects in a wafer such as the semiconductor wafer 200 (FIG. 2). In the X-Y bitmap 300, the locations of the defects are depicted on an X-Y grid in the locations designated by crosses 302. The crosses 302 are positioned in known manner in the array bitmap at locations that correlate to the TOX defect locations on the related semiconductor wafer. The defect patterns in FIG. 3 are depicted generally symmetrically, but it will be understood that the variety of patterns in practice is as diverse as the production and process defects that lead to TOX defects and their corresponding bitmap patterns.

Figure 4:
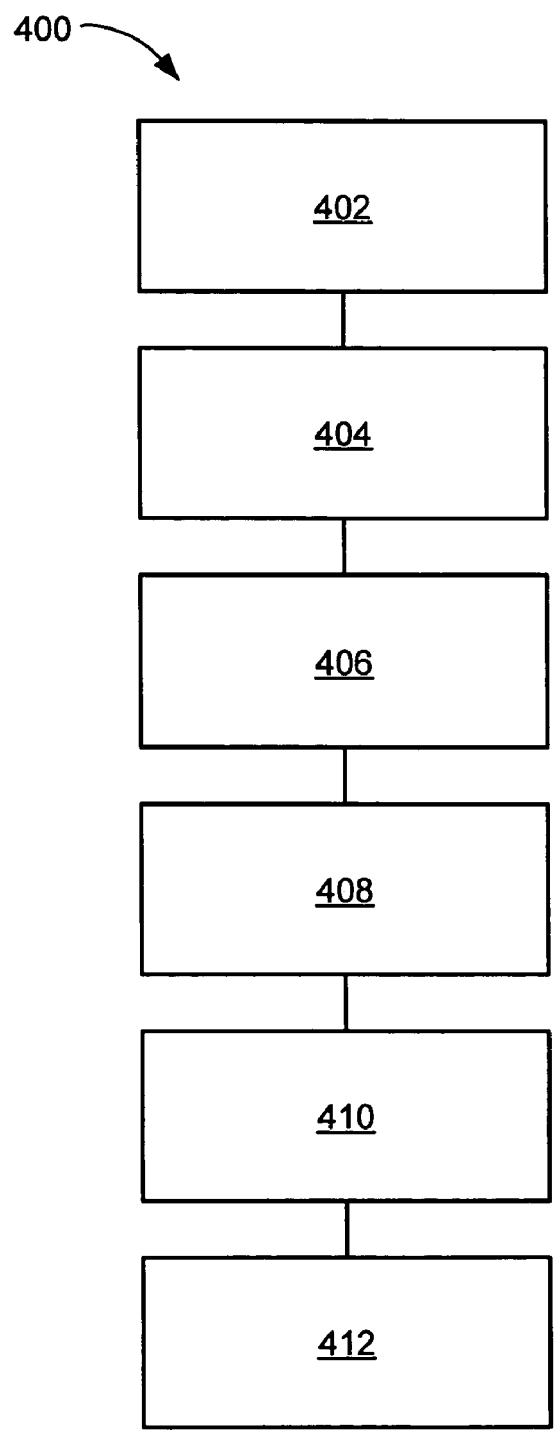
FIG. 4 is a flow chart of a method for determination of tunnel oxide weakness in accordance with the present invention.

Referring now to FIG. 4, therein is shown a flow chart of a method 400 for determination of tunnel oxide weakness in accordance with the present invention. The method 400 includes forming a tunnel oxide layer on a semiconductor wafer in a block 402; forming at least one poly gate on the tunnel oxide layer in a flash memory region of the semiconductor wafer in a block 404; forming at least one poly island on the tunnel oxide layer in a voltage contrast cell region of the semiconductor wafer, the poly island being substantially larger than the poly gate, and the poly island and the tunnel oxide layer therebeneath forming a voltage contrast tunnel oxide cell in a block 406; performing a voltage contrast measurement on the voltage contrast tunnel oxide cell in a block 408; comparing the voltage contrast measurement with prior such voltage contrast measurements on other such voltage contrast tunnel oxide cells in a block 410; and determining the tunnel oxide weakness of the tunnel oxide layer from the voltage contrast measurement comparisons in a block 412.

Thus, it has been discovered that the TOX weakness determination method and apparatus of the present invention furnish important and heretofore unavailable solutions, capabilities, and functional advantages for early and efficient in-line testing and screening of flash memory devices during the fabrication thereof. The resulting processes and configurations are straightforward, economical, uncomplicated, highly versatile and effective, use conventional technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method for determination of tunnel oxide weakness, comprising:

forming a tunnel oxide layer on a semiconductor wafer;

forming at least one poly gate on the tunnel oxide layer in a flash memory region of the semiconductor wafer;

forming at least one poly island on the tunnel oxide layer in a voltage contrast cell region of the semiconductor wafer, the poly island being substantially larger than the poly gate, and the poly island and the tunnel oxide layer therebeneath forming a voltage contrast tunnel oxide cell;

performing a voltage contrast measurement on the voltage contrast tunnel oxide cell;

comparing the voltage contrast measurement with prior such voltage contrast measurements on other such voltage contrast tunnel oxide cells; and determining the tunnel oxide weakness of the tunnel oxide layer from the voltage contrast measurement comparisons.

2. The method of claim 1 wherein performing a voltage contrast measurement further comprises causing a constant standard testing current to flow through the voltage contrast tunnel oxide cell.

3. The method of claim 1 further comprising accumulating a library of such voltage contrast measurements.

4. The method of claim 1 further comprising depicting locations on a bitmap that correlate to the tunnel oxide defect locations on the semiconductor wafer.

5. The method of claim 1 further comprising determining whether to continue or discontinue manufacturing of the semiconductor wafer as a function of the extent of tunnel oxide weakness detected by the voltage contrast tunnel oxide cell measurement.

6. A method for determination of tunnel oxide weakness, comprising:
   forming a tunnel oxide layer on a semiconductor wafer;
   forming at least one poly gate on the tunnel oxide layer in a flash memory region of the semiconductor wafer;
   forming at least one poly island on the tunnel oxide layer in a voltage contrast cell region of the semiconductor wafer, the poly island being substantially larger than the poly gate, and the poly island and the tunnel oxide layer therebeneath forming a voltage contrast tunnel oxide cell;
   performing a voltage contrast measurement on the voltage contrast tunnel oxide cell in a tester;
   generating and extracting test results from the tester;
   comparing the voltage contrast measurement with prior such voltage contrast measurements on other such voltage contrast tunnel oxide cells in an analysis block; and
   determining the tunnel oxide weakness of the tunnel oxide layer from the voltage contrast measurement comparisons.

7. The method of claim 6 wherein performing a voltage contrast measurement further comprises causing a constant standard testing current to flow through the voltage contrast tunnel oxide cell.

8. The method of claim 6 further comprising accumulating a library of such voltage contrast measurements.

9. The method of claim 6 further comprising depicting locations on a bitmap that correlate to the tunnel oxide defect locations on the semiconductor wafer.

10. The method of claim 6 further comprising determining whether to continue or discontinue manufacturing of the semiconductor wafer as a function of the extent of tunnel oxide weakness detected by the voltage contrast tunnel oxide cell measurement.

11. A system for determination of tunnel oxide weakness, comprising:
   a semiconductor wafer having at least one flash memory region and at least one voltage contrast cell region;
   a tunnel oxide layer on the semiconductor wafer;
   at least one poly gate on the tunnel oxide layer in a flash memory region of the semiconductor wafer;
   at least one poly island on the tunnel oxide layer in a voltage contrast cell region of the semiconductor wafer, the poly island being substantially larger than the poly gate, and the poly island and the tunnel oxide layer therebeneath forming a voltage contrast tunnel oxide cell;
   means for performing a voltage contrast measurement on the voltage contrast tunnel oxide cell;
   means for comparing the voltage contrast measurement with prior such voltage contrast measurements on other such voltage contrast tunnel oxide cells; and
   means for determining the tunnel oxide weakness of the tunnel oxide layer from the voltage contrast measurement comparisons.

12. The system of claim 11 wherein the means for performing a voltage contrast measurement further comprises means for causing a constant standard testing current to flow through the voltage contrast tunnel oxide cell.

13. The system of claim 11 further comprising a library of such voltage contrast measurements.

14. The system of claim 11 further comprising a bitmap that depicts locations that correlate to the tunnel oxide defect locations on the semiconductor wafer.

15. The system of claim 11 further comprising means for determining whether to continue or discontinue manufacturing of the semiconductor wafer as a function of the extent of tunnel oxide weakness detected by the voltage contrast tunnel oxide cell measurement.

16. A system for determination of tunnel oxide weakness, comprising:
   a semiconductor wafer having at least one flash memory region and at least one voltage contrast cell region;
   a tunnel oxide layer on the semiconductor wafer;
   at least one poly gate on the tunnel oxide layer in a flash memory region of the semiconductor wafer;
   at least one poly island on the tunnel oxide layer in a voltage contrast cell region of the semiconductor wafer, the poly island being substantially larger than the poly gate, and the poly island and the tunnel oxide layer therebeneath forming a voltage contrast tunnel oxide cell;
   means for performing a voltage contrast measurement on the voltage contrast tunnel oxide cell in a tester;
   means for generating and extracting test results from the tester;
   means for comparing the voltage contrast measurement with prior such voltage contrast measurements on other such voltage contrast tunnel oxide cells in an analysis block; and
   means for determining the tunnel oxide weakness of the tunnel oxide layer from the voltage contrast measurement comparisons.

17. The system of claim 16 wherein the means for performing a voltage contrast measurement further comprises means for causing a constant standard testing current to flow through the voltage contrast tunnel oxide cell.

18. The system of claim 16 further comprising a library of such voltage contrast measurements.

19. The system of claim 16 further comprising a bitmap that depicts locations that correlate to the tunnel oxide defect locations on the semiconductor wafer.

20. The system of claim 16 further comprising means for determining whether to continue or discontinue manufacturing of the semiconductor wafer as a function of the extent of tunnel oxide weakness detected by the voltage contrast tunnel oxide cell measurement.

* * * * *